United States Patent [19]
Cox et al.

[11] 3,909,742
[45] Sept. 30, 1975

[54] LINEAR AMPLIFICATION USING NONLINEAR DEVICES AND FEEDBACK

[75] Inventors: Donald Clyde Cox, New Shrewsbury; Douglas Otto John Reudink, Sea Girt, both of N.J.

[73] Assignee: Bell Telephone Laboratories, Incorporated, Murray Hill, N.J.

[22] Filed: Aug. 19, 1974

[21] Appl. No.: 498,637

[52] U.S. Cl. .............................. 330/84; 330/124 R
[51] Int. Cl.$^2$ ........................ H03F 1/36; H03F 3/68
[58] Field of Search ......... 330/21, 31, 26, 28, 30 R, 330/31, 53, 84, 124 R; 333/10, 11

[56] References Cited

UNITED STATES PATENTS

| | | | |
|---|---|---|---|
| 2,455,332 | 11/1948 | Hare | 179/171 |
| 2,778,883 | 1/1957 | Buckerfield | 179/171 |
| 2,846,523 | 8/1958 | Leavitt et al. | 179/171 |
| 2,864,905 | 12/1958 | Grantges et al. | 179/171 |
| 3,168,703 | 2/1965 | Clynes | 330/10 |
| 3,202,927 | 8/1965 | Ishimoto et al. | 330/84 |
| 3,348,163 | 10/1967 | Hirst | 330/84 |
| 3,426,245 | 2/1969 | Yurasek et al. | 315/27 |
| 3,500,219 | 3/1970 | Rhodes | 330/14 |
| 3,510,794 | 5/1970 | Grib | 330/126 |
| 3,553,491 | 1/1971 | Schulz | 307/235 |
| 3,571,739 | 3/1971 | Seidel | 330/84 X |
| 3,777,275 | 12/1973 | Cox | 330/10 |

*Primary Examiner*—James B. Mullins
*Attorney, Agent, or Firm*—David L. Hurewitz

[57] ABSTRACT

Available devices including hybrid combiners, nonlinear amplifying devices, a phase varying device and an attenuator are used to produce a linearly amplified replica of a bandpass analog signal having amplitude variations. An original analog input signal and a feedback signal are applied to a first hybrid combiner which subtracts the feedback signal from the original input signal to produce one of two components of equal amplitude and adds the feedback signal to the original input signal to produce the other component. The components are amplified separately by nonlinear amplifying devices and the amplified components then recombined by a second hybrid combiner which produces two outputs. One output, the difference between the two components, is a linearly amplified replica of the original input signal. The other output, the sum of the two components, is the feedback signal which is applied through a series combination of the phase varying device and the attenuator to the first hybrid combiner.

8 Claims, 1 Drawing Figure

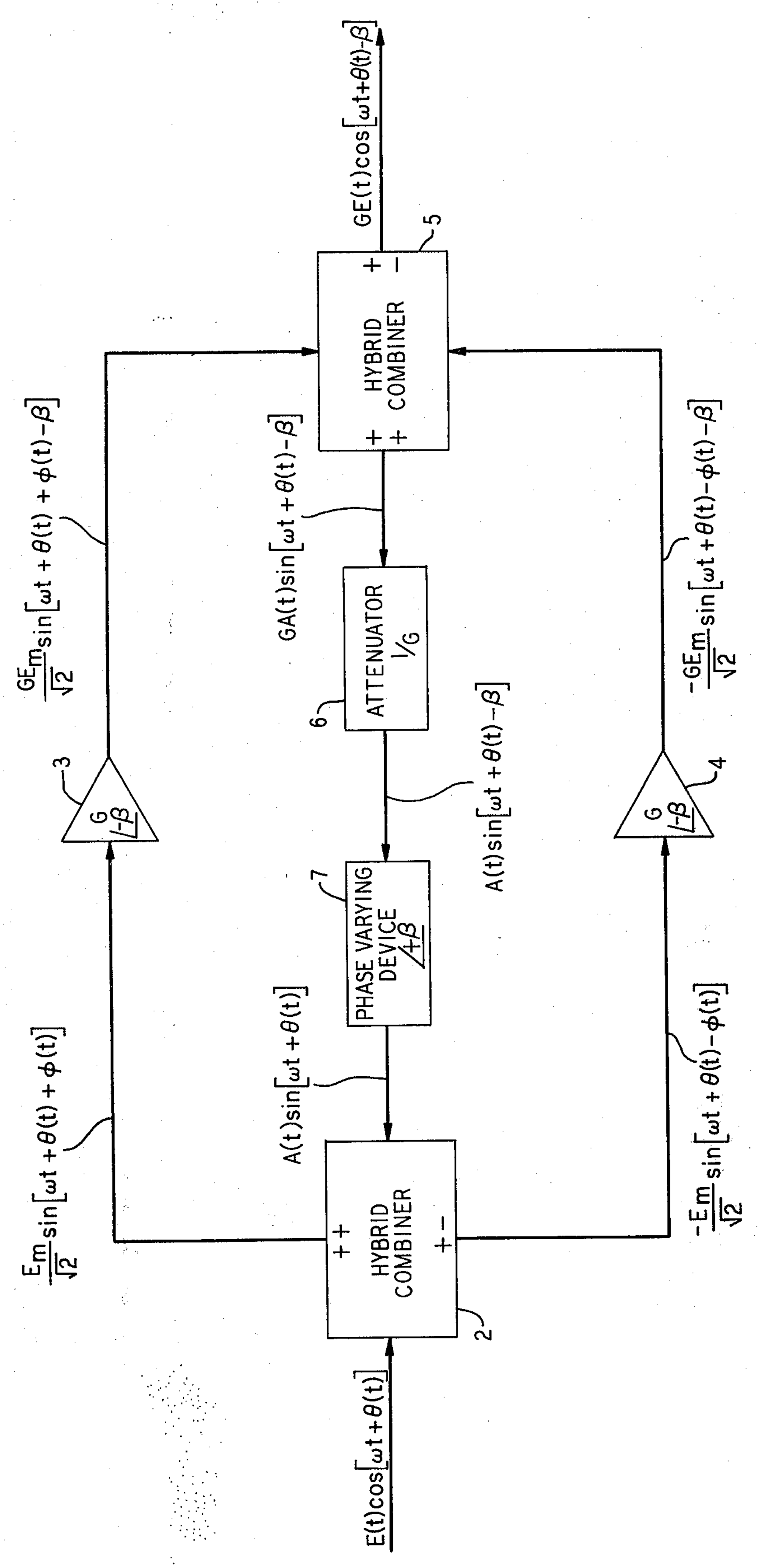
E(t)cos[ωt+θ(t)]
HYBRID COMBINER
2
$\frac{E_m}{\sqrt{2}}$sin[ωt+θ(t)+φ(t)]
$\frac{-E_m}{\sqrt{2}}$sin[ωt+θ(t)−φ(t)]
A(t)sin[ωt+θ(t)]
PHASE VARYING DEVICE ∠+β
7
A(t)sin[ωt+θ(t)−β]
ATTENUATOR 1/G
6
GA(t)sin[ωt+θ(t)−β]
G ∠−β
3
G ∠−β
4
$\frac{GE_m}{\sqrt{2}}$sin[ωt+θ(t)+φ(t)−β]
$\frac{-GE_m}{\sqrt{2}}$sin[ωt+θ(t)−φ(t)−β]
HYBRID COMBINER
5
GE(t)cos[ωt+θ(t)−β]

LINEAR AMPLIFICATION USING NONLINEAR DEVICES AND FEEDBACK

BACKGROUND OF THE INVENTION

This invention relates to amplification circuits and more particularly to circuits for providing linear bandpass amplification and is an alternative to the technique disclosed in U.S. Pat. No. 3,777,275, issued Dec. 4, 1973 to D. C. Cox.

In many communication system applications a linear response to the transmitter power amplifier is required because the signal to be amplified contains amplitude variations and a nonlinear device would cause undesirable distortion. Hence, systems utilizing standard AM transmission and those utilizing more complex amplitude varying signals, such as ones having single sideband modulation or frequency multiplexed sets of separately modulated low-level carriers are severely limited by the availability of linear amplifying devices.

Unfortunately, solid-state linear power amplifiers are difficult to build for microwave and millimeter wave frequencies in the 6 to 100 GHz range, and at lower frequencies, such as 1 to 6 GHz, high power linear devices are often unavailable or very expensive.

Conversely, nonlinear solid-state power amplifiers are readily available at microwave frequencies, such as 1 or 2 GHz, and constant amplitude phase lockable signal sources (GUNN and IMPATT diodes) are available in the 2 to 100 GHz microwave and millimeter wave range. For high power applications in the 0.1 to 10 GHz range, nonlinear electron tube amplifiers and power oscillators are substantially less costly than are linear devices.

It is an object of the present invention to provide linear amplification of amplitude varying analog signals at microwave and millimeter wave frequencies, especially above 1 GHz, by using only available state of the art circuit components including nonlinear amplifying devices. It is also an object of the present invention to utilize the same principles to provide linear amplification suitable for high power applications at lower frequencies.

SUMMARY OF THE INVENTION

In accordance with the present invention an original bandpass analog input signal is linearly amplified by an amplifier having nonlinear components. The original input signal is applied to a first hybrid combiner in which the original input is divided into two constant and equal amplitude components which are then separately amplified in forward paths. The amplified components are recombined in a second hybrid combiner. One output of the second hybrid combiner is the sum of the two amplified components and is fed back as another input signal to the first hybrid combiner. Another output of the second hybrid combiner is the difference of the two amplified components and is an amplified replica of the original bandpass input signal. Thus, the linear amplifier comprises two forward paths and one feedback path. This amplifier may be used where linear amplification at a frequency of 1 GHz or higher is required.

BRIEF DESCRIPTION OF THE DRAWING

The FIGURE is a block diagram of the linear amplifier in accordance with the invention.

DETAILED DESCRIPTION

As shown in the FIGURE, an original bandpass input signal $E(t)\cos[\omega t + \theta(t)]$ is applied to one input of hybrid combiner 2 where $E(t)$ is the amplitude variation of the bandpass signal, $\omega$ is the radian frequency of the input signal, $t$ is time and $\theta(t)$ is the instantaneous phase variation of the bandpass signal. A feedback input signal designated $A(t)\sin[\,)]t + \theta(t)]$ is applied to the other input of hybrid combiner 2 where $$A(t) = E_m \cos\left[\sin^{-1}\frac{E(t)}{E_m}\right] \qquad (1)$$

and $E_m$ is the maximum value of $E(t)$. Hybrid combiner 2, which may be a magic tee device, is a passive device which adds and subtracts the two input signals to hybrid combiner 2 to produce two equal amplitude output signals the phases of which contain the total information content of the input. One output signal is the sum of the two inputs and the other output signal is the difference between the two inputs. If $\phi(t)$ is defined as $$\sin^{-1}\frac{E(t)}{E_m}$$

then $$E(t) = E_m \sin\phi(t) \qquad (2)$$

and the original input signal $$E(t)\cos[\omega t + \theta(t)] = E_m/2\Big[\sin[\omega t = \theta(t) + \phi(t)] - \sin[\omega t + \theta(t) - \phi(t)]\Big]. \qquad (3)$$

Since $$A(t) = E_m \cos\left[\sin^{-1}\frac{E(t)}{E_m}\right] \qquad (4)$$

and )]+

$$\sin^{-1}\frac{E(t)}{E_m} = \phi(t) \qquad (5)$$

then $$A(t) = E_m \cos\phi(t) \qquad (6)$$

and the feedback input signal $$A(t)\sin[\omega t + \theta(t)] = E_m/2\Big[\sin[\omega t + \theta(t) + \phi(t)] + \sin[\omega t + \theta(t) - \phi(t)]\Big]. \qquad (7)$$

The sum of the the two input signals to hybrid combiner 2 is then $$E(t)\cos[\omega t + \theta(t)] + A(t)\sin[\omega t + \theta(t)] = E_m/2\Big[\sin[\omega t + \theta(t) + \phi(t)] - \sin[\omega t + \theta(t) - \phi(t)]\Big] + E_m/2\Big[\sin[\omega t + \theta(t) + \phi(t)] + \sin[\omega t + \theta(t) - \phi(t)]\Big] = E_m \sin[\omega t + \theta(t) + \phi(t)]. \qquad (8)$$

Similarly, the difference of the two input signals to hybrid combiner 2 is $E(t)\cos[\omega t + \theta(t)] - A(t)\sin[\omega t + \theta(t)]$, and this difference may be shown to equal $-E_m \sin[\omega t + \theta(t) - \phi(t)]$.

Since the hybrid combiner 2 is a dissipationless passive linear device and conserves power, the total output power from the hybrid combiner must equal the total input power to the hybrid combiner. The impedances of all the ports of combiner 2 are assumed to be equal. Therefore, the signal emanating from a summing port of combiner 2 indicated by ++ in the FIGURE is $$\frac{1}{\sqrt{2}}\left[E(t)\cos[\omega t+\theta(t)] + A(t)\sin[\omega t+\theta(t)]\right] = \frac{E_m}{\sqrt{2}}\sin[\omega t+\theta(t)+\phi(t)] \quad (9)$$

and the signal emanating from a differencing port, indicated by +−, is $$\frac{1}{\sqrt{2}}\left[E(t)\cos[\omega t+\theta(t)] - A(t)\sin[\omega t+\theta(t)]+\right] = \frac{E_m}{\sqrt{2}}\sin[\omega t+\theta(t)-\phi(t)] \quad (10)$$

as shown in the FIGURE in accordance with the above derived relationships. The factor $1/\sqrt{2}$ is a direct result of the conservation of power and the assumption of equal inmpedances. These two output signals from combiner 2 are, except for a constant factor, the same as the constant envelope components $E_m/2\ \sin[\omega t + \theta(t) + \phi(t)]$ and $E_m/2\ \sin[\omega t + \theta(t) - \phi(t)]$ found in the aforementioned Cox patent.

The two signals from combiner 2 are applied to nonlinear amplifying devices 3 and 4. These nonlinear amplifying devices may be limiting or saturating amplifiers or phase locked oscillators, each having gain G and a fixed phase shift angle $-\beta$ designated $<-\beta$, which is the phase shift incurred in any finite bandwidth amplifier The outputs of devices 3 and 4 are therefore $$\frac{GE_m}{\sqrt{2}}\sin\ [\omega t+\theta(t)+\phi(t)-\beta] \text{ and } \frac{-GE_m}{\sqrt{2}}\sin\ [\omega t+\theta(t)-\phi(t)-\beta],$$

respectively.

The amplified constant envelope components are applied as inputs to hybrid combiner 5 which adds and subtracts the amplified components in a manner similar to the operation of hybrid combiner 2 to produce two outputs. One output, shown at the +− port is the difference of the two amplified components divided by 2

$$\frac{1}{\sqrt{2}}\left[\frac{GE_m}{\sqrt{2}}\sin\ [\omega t+\theta(t)+\phi(t)-\beta] - \frac{GE_m}{\sqrt{2}}\sin[\omega t+\theta(t)-\phi(t)-\beta]+\right] =$$
$$GE_m/2\ \big[\sin[\omega t+\theta(t)-\beta]\cos\ \phi(t) + \cos[\omega t+\theta(t)-\beta]\sin\ \phi(t) -$$
$$\sin[\omega t+\theta(t)-\beta]\cos\ \phi(t) + \cos[\omega t+\theta(t-\beta]\sin\ \phi(t)\big] =$$
$$GE(t)\cos[\omega t+\theta(t)-\beta]. \quad (11)$$

The $\sqrt{2}$ dividing factor results from power conservation and the equal port impedances in combiner 5 as discussed above in regard to combiner 2. The difference of the two amplified components is thus an amplified and phase shifted replica of the original input signal $E(t)\cos[\omega t + \theta(t)]$. The other output of hybrid combiner 5 shown at the ++ port is the sum of the amplified components and this output similarly may be shown to equal $GA(t)\sin[\omega t + \theta(t) - \beta]$. This summed output from hybrid combiner 5 is applied along a feedback path of attenuator 6 of gain $1/G$. This device may be, for example, a resistive card, resistive pi to T structure which reduces the amplitude of the feedback signal by a factor $1/G$ such that the constant amplitude components to the nonlinear devices 3 and 4 will cause the nonlinear devices to operate at a gain $G$. In other words, the attenuator effectively determines the operating gain $G$ of the nonlinear devices 3 and 4 and in turn the gain of the total circuit.

The output of attenuator 6 is applied to phase varying device 7, the loss of which is considered to be part of the loss of attenuator 6. The phase varying device, which may be a rotary vane or line stretcher, is adjusted to have a phase shift of $+\beta$ at the frequency $\omega$, the center frequency of operation of the proposed linear amplifier. The phase varying device adjusts the phase of the feedback signal so that the phase angle of the feedback signal applied to hybrid combiner 2 equals that of the original input signal at the center frequency $\omega$. The center frequency is that frequency for which the phase shift around each loop comprising a forward path from combiner 2 to combiner 5 and the feedback path is an integral multiple of $2\pi$ radians. The phase shift around each loop must be the same integral multiple of $2\pi$ radians in order to prevent development of a phase offset for spectral components of the original input signal $E(t)\cos[\omega t + \theta(t)]$ that are not at the center frequency. This phase shift $+\beta$ produces the desired feedback signal $A(t)\sin[\omega t + \theta(t)]$ necessary to produce the two equal constant amplitude output components from hybrid combiner 2 required for distortionless amplification by nonlinear devices 3 and 4.

Since attenuator 6 and phase varying device 7 are linear devices, their positions in the linear amplifier may be interchanged without affecting the operation of the amplifier.

In all cases it is to be understood that the above described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. In apparatus for linearly amplifying a bandpass high frequency analog input signal having amplitude variations, plural amplifying means the characteristic of which is nonlinear as contrasted with the requirement for linearity between input and output;

means for producing from the input signal at least two signal components having constant amplitude but differing in phase;

means for applying said component signals for separate amplification in respective ones of said plural nonlinear amplifying means;

means for recombining the amplified components to produce a linearly amplified replica of the input signal, the replica being the difference of the two amplified components;

said means for recombining also producing a feedback signal, the feedback signal being the sum of the two amplified components;

and said means for producing a pair of components including means for combining the input and the feedback signal.

2. Apparatus as described in claim 1 wherein said means for combining comprises a series arrangement of an attenuator and an adjustable phase varying device which adjusts the phase of the feedback signal to equal that of the original input and adjusts the amplitude of the feedback signal to a desired level.

3. Apparatus as described in claim 1 wherein said means for producing includes a first hybrid combiner and said means for recombining in a second hybrid combiner, each hybrid combiner having two inputs and two outputs, one output being the sum of the two input signals and the other output being the difference of the two input signals.

4. Apparatus as described in claim 1 wherein said means for amplifying includes two nonlinear amplifiers, each amplifying respective ones of the components.

5. In apparatus for linearly amplifying a high frequency bandpass analog input signal having amplitude variations, plural amplifying means the transmission characteristic of which is nonlinear as contrasted with the requirement for linearity between input and output;

means for producing from the input signal at least two signal components having equal amplitude but differing in phase;

means for applying said component signals for separate amplification in respective ones of said plural nonlinear amplifying means;

means for recombining the amplified components to produce a replica of the input signal, said means for recombining also producing a feedback signal; and means for applying the feedback signal to said means for producing a pair of components.

6. Apparatus as described in claim 5 wherein said means for producing and said means for recombining are a first and second hybrid combiner, respectively, each having two inputs and two outputs, one output being the sum of the two inputs, the other output being the difference of the two inputs.

7. Apparatus as described in claim 6 wherein the feedback signal is the summed output of the means for recombining, and the replica is the difference of the two inputs applied to said means for recombining.

8. Apparatus as described in claim 5 wherein said means for applying includes the series combination of a phase varying device and an attenuator to which is applied the summed output of said means for recombining and from which emanates an output which is one of the two inputs applied to said means for producing.

* * * * *